US009390644B2

(12) United States Patent
Ka et al.

(10) Patent No.: US 9,390,644 B2
(45) Date of Patent: Jul. 12, 2016

(54) DETECTING METHOD OF DEFECTS OF LINE AND DEMULTIPLEXER, DEFECT DETECTING DEVICE, AND DISPLAY PANEL INCLUDING THE DEFECT DETECTING DEVICE

(75) Inventors: Ji-Hyun Ka, Yonogin (KR); Jin-Tae Jeong, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 457 days.

(21) Appl. No.: 13/484,644

(22) Filed: May 31, 2012

(65) Prior Publication Data

US 2013/0141314 A1 Jun. 6, 2013

(30) Foreign Application Priority Data

Dec. 1, 2011 (KR) ........................ 10-2011-0127807

(51) Int. Cl.
*G01R 31/02* (2006.01)
*G09G 3/00* (2006.01)
*G09G 3/32* (2016.01)

(52) U.S. Cl.
CPC .............. *G09G 3/006* (2013.01); *G09G 3/3233* (2013.01); *G09G 3/3291* (2013.01); *G09G 2310/0297* (2013.01); *G09G 2330/12* (2013.01)

(58) Field of Classification Search
CPC ...................................................... G09G 3/006
See application file for complete search history.

(56) References Cited

U.S. PATENT DOCUMENTS 7,663,396 B2 * 2/2010 Kawata .................... 324/760.01
8,451,445 B2 * 5/2013 Bai et al. ....................... 356/364
8,525,757 B2 * 9/2013 Nishi et al. ....................... 345/76
2003/0085855 A1 5/2003 Tomita
2004/0012552 A1 1/2004 Fujita
2008/0054798 A1 3/2008 Jeong et al.
2008/0303749 A1 * 12/2008 Cassidy et al. .................. 345/55
2009/0050889 A1 * 2/2009 Chien et al. ...................... 257/59
2011/0018571 A1 * 1/2011 Kim et al. ................ 324/760.02
2011/0043500 A1 2/2011 Kwak et al.
2011/0221733 A1 9/2011 Sato
2012/0299972 A1 * 11/2012 Bae .............................. 345/690

FOREIGN PATENT DOCUMENTS

CN 101539693(A) 9/2009
CN 101963709(A) 2/2011
CN 202976770(U) 6/2013
JP 2011-186301 A 9/2011
KR 10-2006-0106323 A 10/2006
KR 10-2007-0056676 A 6/2007
KR 10-2010-0071536 A 6/2010
WO WO 2011/089762 A1 7/2011

OTHER PUBLICATIONS

Extended European Search Report for 12179991.0 dated Jun. 2, 2015; Ka, et al.

* cited by examiner

*Primary Examiner* — Tung X Nguyen
*Assistant Examiner* — Feba Pothen
(74) *Attorney, Agent, or Firm* — Lee & Morse, P.C.

(57) ABSTRACT

Embodiments relate to a defect detecting method of a line and a demultiplexer, a defect detecting device, and a display panel including the defect detecting device. A demultiplexer may connect a plurality of data lines to a plurality of corresponding lines. The defect detecting device includes DC lines supplied with respective DC voltages, first switches connected to the DC lines and configured to transmit the respective DC voltages to the corresponding first data lines among a plurality of data lines according to a first gate signal, and second switches connected to the first to third DC lines and configured to transmit one of the respective DC voltages to corresponding second data lines among a plurality of data lines according to a second gate signal.

18 Claims, 10 Drawing Sheets

DETECTING METHOD OF DEFECTS OF LINE AND DEMULTIPLEXER, DEFECT DETECTING DEVICE, AND DISPLAY PANEL INCLUDING THE DEFECT DETECTING DEVICE

BACKGROUND

1. Field

One or more embodiments relate to a method and a device for detecting a defect in a demultiplexer and/or a line included in a display device, and a display panel including a defect detecting device.

2. Description of the Related Art

Red, Green, and Blue (RGB)-DC voltages and a gate signal are used to check a display panel of an active matrix method.

In such a display panel, a plurality of red pixels are supplied with a red (R) DC voltage in synchronization with a gate signal, a plurality of green pixels are supplied with a green (G) DC voltage in synchronization with the gate signal, and a plurality of blue pixels are supplied with a blue (B) DC voltage in synchronization with the gate signal.

The red, green, and blue pixels emit light by the R DC voltage, the G DC voltage, and the B DC voltage, and mura, which are black/white spots, line defects, etc., are checked in a light emitting state.

During this checking operation, a demultiplexer positioned between the display panel and the data driving circuit is in an off state. Accordingly, defects of a line between the demultiplexer and the data driving circuit, and a thin film transistor (TFT) forming the demultiplexer, may not be detected.

The above information disclosed in this Background section is only for enhancement of understanding of the background of the invention and therefore it may contain information that does not form the prior art that is already known in this country to a person of ordinary skill in the art.

SUMMARY

One or more embodiments provide a method and a device detecting defect of a line and a demultiplexer.

One or more embodiments provide a method and a device for detecting a defect in a line and/or a demultiplexer, and a display panel including the same.

One or more embodiments provide a defect detecting device using a demultiplexer connecting corresponding ones of a plurality of data lines to a plurality of lines, the defect detecting device including first to third DC lines supplied with first to third DC voltages, a plurality of first switches connected to the first to third DC lines and configured to transmit one of the first to third DC voltages to a plurality of the first data lines among the plurality of data lines according to a first gate signal, and a plurality of second switches connected to the first to third DC lines and configured to transmit one of the first to third DC voltages to a plurality of second data lines among the plurality of data lines according to a second gate signal.

The demultiplexer may include a plurality of first TFTs connecting a plurality of first lines of the plurality of lines and corresponding ones of the plurality of data lines, and a plurality of second TFTs connecting a plurality of second lines of the plurality of lines and corresponding ones of the plurality of data lines, wherein, when the defect detecting device detects a short defect in the plurality of lines, the plurality of the first switches and the plurality of the second switches are in an on state, and only one of the plurality of first TFTs or the plurality of second TFTs are in an on state.

When the plurality of first TFTs are in the on state, corresponding ones of the plurality of lines and the plurality of data lines are connected through the plurality of first TFTs, respectively, and, when one of the plurality of lines is shorted, the plurality of pixels, which are connected to the shorted line via corresponding ones of the data lines, emit light according to a short voltage resulting from the shorted line.

When the plurality of second TFTs are in the on state, corresponding ones of the plurality of lines and the plurality of data lines are connected through the plurality of second TFTs, and when one of the plurality of lines is shorted, the plurality of pixels, which are connected to the shorted line via the corresponding ones of the data lines, emit light according to a short voltage resulting from the shorted line.

The demultiplexer may include a plurality of first TFTs connecting the plurality of lines and corresponding ones of the data lines among the plurality of data lines, a plurality of second TFTs connecting the plurality of lines and corresponding ones of the data lines among the plurality of data lines, and, when the defect detecting device detects a defect in the plurality of the first TFTs and the plurality of the second TFTs, the plurality of the first TFTs and the plurality of the second TFTs are in an on state, and only one of the plurality of the first switches or the plurality of second switches are in an on state.

When the plurality of the first switches are in the on state, and the plurality of the first TFTs and the plurality of second TFTs are in an on state, the first data lines, which are respectively connected to the plurality of the first switches in the on state are connected to corresponding ones of the second data lines through respective ones of the first and/or the second TFTs.

When at least one of the first and the second TFTs is defective, corresponding ones of the second data lines do not receive and/or transmit the corresponding one of the DC voltages among the first to third DC voltages.

When a plurality of the second switches are in the on state, and the plurality of the first TFTs and the plurality of second TFTs are in an on state, the second data lines, which are respectively connected to the plurality of the second switches in the on state are connected to corresponding ones of the first data lines through respective ones of the first and/or the second TFTs.

When at least one of the first and the second TFTs is defective, corresponding ones of the first data lines do not receive and/or transmit the corresponding one of the DC voltages among the first to third DC voltages.

Each of the plurality of first switches may include a gate electrode configured to receive the first gate signal, a first electrode connected to a corresponding one of the first to third DC lines, and a second electrode connected to a corresponding one of the first data lines.

Each of the plurality of second switches may include a gate electrode configured to receive the second gate signal, a first electrode connected to a corresponding one of the first to third DC lines, and a second electrode connected to a corresponding one of the second data lines.

One or more embodiment provide a defect detecting method for a line connected to a first data line corresponding to a first pixel array and a second data line corresponding to a second pixel array through a first TFT and a second TFT, the defect detecting method including supplying a first DC voltage to the first data line and the second data line, turning on only one of the first TFT and the second TFT, and detecting a defect according to a light emitting state of the first or the second pixel array connected to the turned-on one of the first and the second TFTs.

When the first TFT is turned on, detecting a defect may include detecting the line as defective when the first pixel array is in a light emitting state that produces a dark line or a bright line relative to a predetermined luminance.

Detecting a defect may include detecting the line as defective when the first pixel array is in a light emitting state that produces a line that is dark or bright relative to an intermediate grayscale among a grayscale range.

When the second TFT is turned on, detecting a defect may include detecting the line as defective when the second pixel array is in a light emitting state that produces a dark line or a bright line relative to a predetermined luminance.

One or more embodiments provide a defect detecting method for a demultiplexer including a first TFT and a second TFT respectively connected to a first data line connected to a first switch and a first pixel array, and a second data line connected to a second switch and a second pixel array, the defect detecting method including turning on only one of the first switch and the second switch, turning on the first TFT and the second TFT, and detecting a defect in the first TFT and/or the second TFT according to a light emitting state of the first pixel array and the second pixel array.

Detecting a defect may include detecting a defect in the first TFT and/or the second TFT when the light emitting state of the first pixel array and the second pixel array are different.

When the first switch is turned on, detecting a defect may include detecting at least one of the first TFT and the second TFT as defective when the first pixel array is displayed with black and the second pixel array is displayed with a predetermined luminance.

When the second switch is turned on, detecting a defect may include detecting at least one of the first TFT and the second TFT as defective when the second pixel array is displayed with black, and the first pixel array is displayed with a predetermined luminance.

One or more embodiments provide a display panel including a plurality of data lines, a plurality of pixels respectively connected to the plurality of data lines, a demultiplexer connecting a plurality of data lines to a plurality of corresponding lines, and a defect detecting device configured to detect a defect in a plurality of lines and/or the demultiplexer, the defect detecting device including a plurality of first switches configured to transmit one among first to third DC voltages to a plurality of corresponding first data lines among a plurality of data lines according to a first gate signal, and a plurality of second switches configured to transmit one among the first to third DC voltages to a plurality of corresponding second data lines among a plurality of data lines according to a second gate signal.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
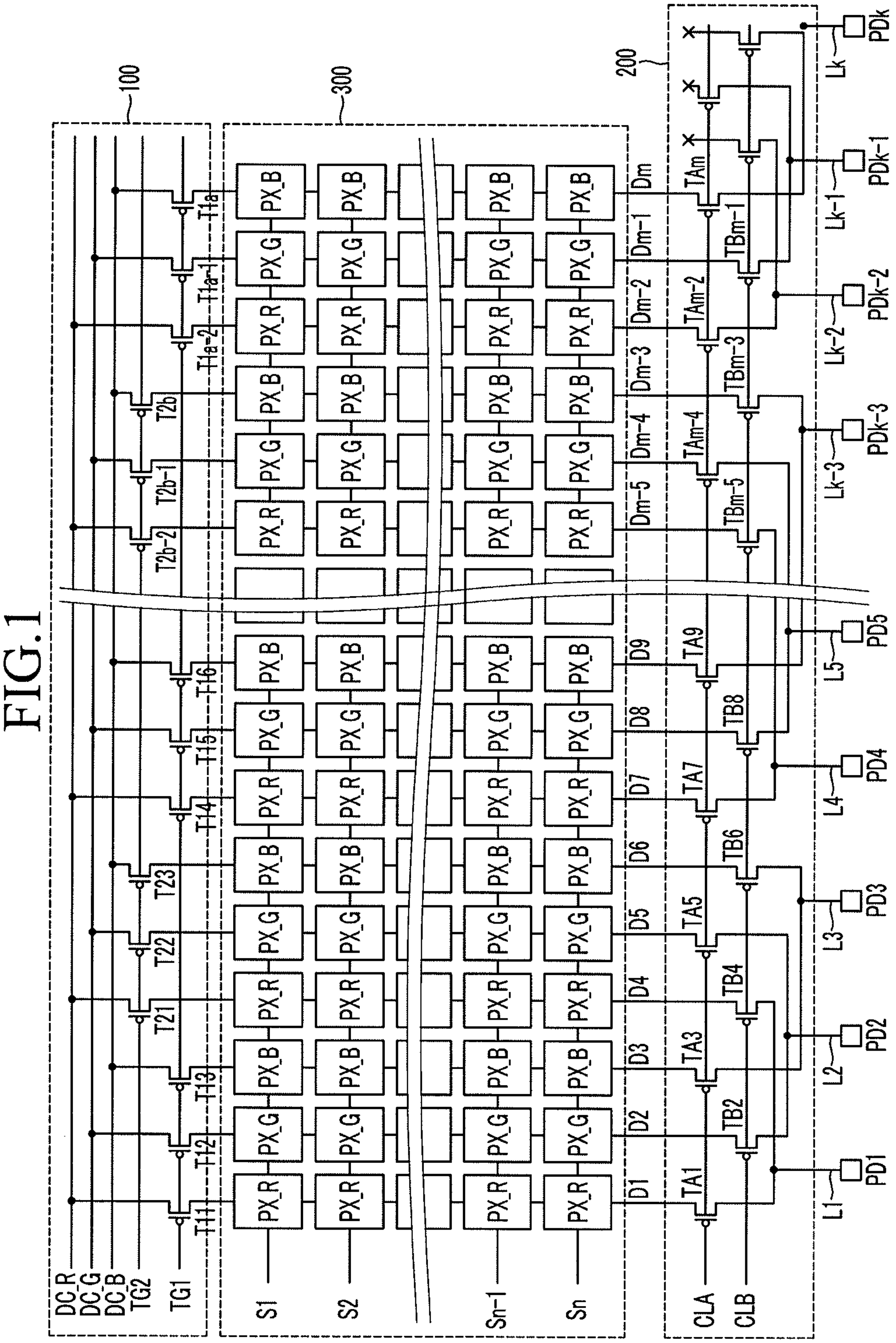
FIG. 1 illustrates a schematic diagram of a display device including a defect detecting device according to an exemplary embodiment.

Korean Patent Application No. 10-2011-0127807, filed on Dec. 1, 2011, in the Korean Intellectual Property Office, and entitled: "Detecting Method of Defects of Line and Demultiplexer, Defect Detecting Device, and Display Panel Including the Defect Detecting Device," is incorporated by reference herein in its entirety.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

Exemplary embodiments of a defect detecting method, a defect detecting device, and a display device including the same will be described with reference to accompanying drawings.

FIG. 1 illustrates a schematic diagram of an exemplary embodiment of a display device including a defect detecting device 100, a demultiplexer 200, and/or a display unit 300.

The display unit 300 may include a plurality of scan lines S1-Sn, a plurality of data lines D1-Dm, and a plurality of pixels PX_R, PX_G, PX_B formed at intersection regions of a plurality of scan lines S1-Sn and a plurality of data lines D1-Dm.

The defect detecting device 100 may be connected to the plurality of data lines D1-Dm and may transmit a red DC voltage RDV, a green DC voltage GDV, and a blue DC voltage BDV to the plurality of data lines D1-Dm according to a plurality of, e.g., two, test gate signals TGS1, TGS2.

The defect detecting device 100 may include a plurality of, e.g., two, gate lines TG1, TG2, a red DC line DC_R, a green DC line DC_G, a blue DC line DC_B, a plurality of the first control switches T11-T1*a*, and a plurality of the second control switches T21-T2*b*.

Referring to FIG. 1, the first gate line TG1 may be connected to gate electrodes of the plurality of first control switches T11-T1*a*, and the second gate line TG2 may be connected to gate electrodes of a plurality of the second control switches T21-T2*b*.

The first gate signal TGS1 may be transmitted to the gate electrodes of the plurality of first control switches T11-T1*a* through the first gate line TG1. The second gate signal TGS2 may be transmitted to the gate electrodes of the plurality of second control switches T21-T2*b* through the second gate line TG2.

The plurality of the first control switches T11-T1*a* and the plurality of the second control switches T21-T2*b* may be realized by P channel transistors. In such embodiments, an enable level of the first and second gate signals TGS1 and TGS2 is a low level while a disable level is a high level.

The plurality of the first switches T11-T1*a* may each include a source electrode connected to a corresponding one of DC lines among the red DC line DC_R, the green DC line DC_G, and the blue DC line DC_B, and a drain electrode connected to the corresponding data line among the plurality of data lines D1-Dm.

The plurality of the second switches T21-T2*b* may each include a source electrode connected to a corresponding one of the DC lines among the red DC line DC_R, the green DC line DC_G, and the blue DC line DC_B, and a drain electrode connected to the corresponding data line among the plurality of data lines D1-Dm.

In one or more embodiments, when a defect in lines L1-Lk is determined through the defect detecting device 100, the first and second gate signals TGS1 and TGS2 are both at the enable level. In one or more embodiments, when a defect in the demultiplexer 200 is determined through the defect detecting device 100, only one of the first and second gate signals TGS1 and TGS2 is at the enable level.

In the display unit 300, the plurality of scan lines S1-Sn may be arranged to extend in a row direction, and a plurality of pixels PX_R, PX_G, and PX_B of one row may be connected to the same scan line. The plurality of data lines D1-Dm may be arranged to extend in a column direction, and the plurality of pixels PX_R, PX_G, and PX_B of one column may be connected to the same data line.

Each of the plurality of pixels PX_R, PX_G, PX_B may include a driving circuit and a light emitting element. Each driving circuit of the plurality of pixels PX_R, PX_G, PX_B may write the data signal transmitted through the corresponding data line by the scan signal transmitted through the corresponding scan line, and a driving current according to the written data signal may be generated and supplied to the respective light emitting element.

Figure 2:
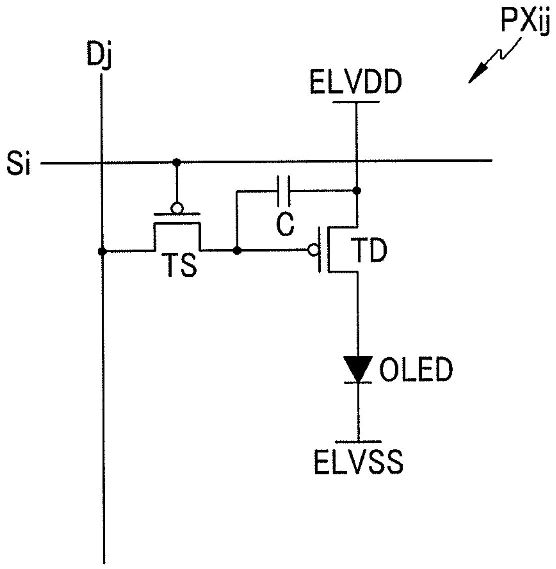
FIG. 2 illustrates a schematic diagram of an exemplary embodiment of a pixel of the display device of FIG. 1.

FIG. 2 illustrates a schematic diagram of an exemplary embodiment of a pixel PXij of the display device of FIG. 1. The pixel PXij may correspond to one, some or all of the plurality of pixels PX_R, PX_G, PX_B of the display unit 300. The pixel PXij shown in FIG. 2 is a pixel connected to the i-th scan line Si and the j-th data lines Dj. Exemplary embodiments are not limited thereto.

As shown in FIG. 2, the pixel PXij may include a switching transistor TS, a driving transistor TD, a capacitor C, and an organic light emitting device (OLED).

The switching transistor TS may include a gate electrode connected to the scan line Si, a first electrode connected to the data line Dj, and a second electrode connected to the gate electrode of the driving transistor TD.

The driving transistor TD may include a source electrode connected to a first voltage source ELVDD, a drain electrode connected to an anode of the organic light emitting device (OLED), and a gate electrode connected to the switching transistor TS.

The capacitor C may be connected between the gate electrode and the source electrode of the driving transistor TD, and a cathode of the OLED is connected to a second voltage source ELVSS.

When a scan signal transmitted through the scan line Si is the low level, the switching transistor TS is turned on, and the capacitor C is charged by the data signal transmitted through the data lines Dj.

The gate voltage of the driving transistor TD is constantly maintained by the capacitor C for a next scan, and a driving current of the driving transistor TD is generated depending on a difference of the gate-source voltage thereof. The organic light emitting device (OLED) may emit light according to the driving current.

The demultiplexer 200 may be connected between a plurality of lines L1-Lk and a plurality of data lines D1-Dm. The plurality of lines L1-Lk are connected to a plurality of pads PD1-PDk, and a plurality of data signals input to a plurality of pads PD1-PDk are transmitted to the demultiplexer 200 through a plurality of lines L1-Lk.

The demultiplexer 200 may transmit a plurality of data signals transmitted through a plurality of lines L1-Lk to a plurality of corresponding data lines through a plurality of TFTs. The demultiplexer 200 may include a plurality of the first TFTs TA1, TA3, . . . , TAm, a plurality of the second TFTs TB2, TB4, . . . , TBm-1, a first control line CLA, and a second control line CLB.

The first control line CLA is connected to gate electrodes of the plurality of first TFTs TA1, TA3, . . . , TAm. A first control signal CON1 for controlling the plurality of first TFTs TA1, TA3, . . . , TAm through the first control line CLA is transmitted to the gate electrodes of the plurality of first TFTs TA1, TA3, . . . , TAm.

The second control line CLB is connected to gate electrodes of the plurality of second TFTs TB2, TB4, . . . , TBm-1. A second control signal CON2 for controlling a plurality of the second TFTs TB2, TB4, . . . , TBm-1 through the second control line CLB is transmitted to the gate electrodes of the plurality of second TFTs TB2, TB4, . . . , TBm-1.

In one or more embodiments in which a plurality of pads PD1-PDk are connected to a data driving circuit (not shown), a plurality of data signals may be input from the data driving circuit to the plurality of pads PD1-PDk.

In one or more embodiments, if the plurality of first TFTs TA1, TA3, . . . , TAm are turned on by the first control signal CON1, the plurality of data lines D1, D3, . . . , Dm may transmit respective data signals, and if the plurality of second TFTs TB2, TB4, . . . , TBm-1 are turned on by the second control signal CON2, the plurality of data lines D2, D4, . . . , Dm-1 may transmit respective data signals.

In one or more embodiments, it may be determined that there is a defect in one or more of the lines L1-Lk and/or a defect in the demultiplexer 200 if the plurality of the first TFTs TA1, TA3, . . . , TAm and the plurality of the second TFTs TB2, TB4, . . . , TBm-1, and a plurality of pads PD1-PDk are not connected to the data driving circuit.

When detecting a defect in the plurality of lines L1-Lk, only one group of a plurality of the first TFTs TA1, TA3, . . . , TAm and the plurality of the second TFTs TB2, TB4, . . . , TBm-1 may be in a turn-on state. When detecting a defect in the plurality of the first TFTs TA1, TA3, . . . , TAm and a plurality of the second TFTs TB2, TB4, . . . , TBm-1, may be in a turn-on state.

Next, an exemplary embodiment of a method of detecting a line defect will be described with reference to FIG. 3 to FIG. 6. For better understanding and ease of description, in FIGS. 3-6, nine (9) pixels are shown as an example of a plurality of pixels.

To detect a line defect, the plurality of scan lines S1-Sn transmit a plurality of scan signals having a level for turning on the respective switching transistor TS. When detecting a line defect, a level of the red, green, and blue DC voltages RDV, GDV, and BDV is determined according to a detecting condition.

For example, if a line is short-circuited to the second voltage source ELVSS, the pixel array connected to the shorted line emits light with a high luminance. Alternatively, if the line is short-circuited to the first voltage source ELVDD, the pixel array connected to the shorted line does not emit light. Accordingly, a degree of the red, green, and/or blue DC voltage RDV, GDV, and BDV levels may be used to distinguish a pixel array connected to a normal line from a pixel array connected to a line shorted to the first voltage source ELVSS or the second voltage source ELVDD.

In one or more embodiments, the red, green, and blue DC voltages RDV, GDV, and BDV may be determined as a same level as a data voltage corresponding to an intermediate grayscale among a grayscale range.

Figure 3:
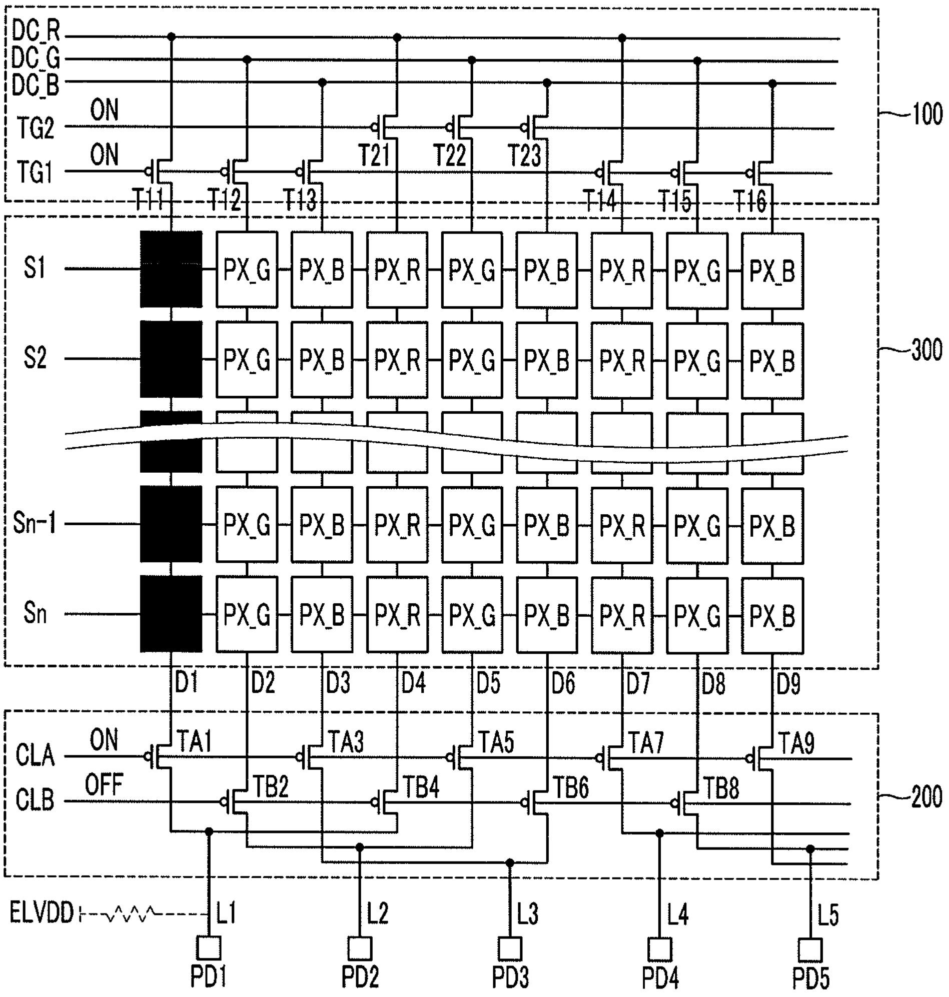
FIG. 3 illustrates schematic view of the defect detecting device and the demultiplexer of FIG. 1 in a defective state.

FIG. 3 illustrates schematic view of the defect detecting device 100 and the demultiplexer 200 of FIG. 1 in a defective state (e.g., line L1 shorted with the first voltage source ELVDD).

As shown in FIG. 3, a plurality of the first switches T11-T1*a* and a plurality of the second switches T21-T2*b* are all in a turned-on state by the first gate signal TGS1 and the second gate signal TGS2, and a plurality of the first TFTs TA1, TA3, . . . , TAm are in a turn-on state by the first control signal CON1. Thus, a plurality of lines L1-Lk are connected to a plurality of data lines D1-Dm through a plurality of the turned-on first TFTs TA1, TA3, . . . , TAm.

In the exemplary embodiment of FIG. 3, the plurality of data lines Dl-Dm are supplied with corresponding DC voltages among the red, green and blue DC voltages RDV, GDV, and BDV through the corresponding first switch (or the second switch), and the plurality of pads PD1-PDk are not connected to the data driving circuit, thereby being in a floating state. Accordingly, the red, green, and blue DC voltages RDV, GDV, and BDV transmitted through a plurality of data lines Dl-Dm are transmitted to a plurality of pixels PX_R, PX_G, and PX_B, and a plurality of pixels PX_R, PX_G, and PX_B emit the light according to the red, green, and blue DC voltages RDV, GDV, and BDV.

At this time, if a short line is generated among the plurality of lines L1-Lk, the data lines connected to the short line are shorted through the short line, and respective ones of the plurality of pixels PX_R, PX_G, and PX_B connected to the shorted data lines emit light with a luminance different from that of the pixels connected to the line that is not shorted.

For example, as shown in FIG. 3, it is assumed that the line L1 is shorted to the first voltage source ELVDD. A resistor component may exist between the line L1 and the first voltage source ELVDD.

The line L1 is connected to the data lines D1 through the turned-on first TFT TAI. Accordingly, the data line D1 is supplied with a high level voltage similar to a voltage of the first voltage source ELVDD. Thus, a gate electrode of the driving transistor TD is supplied with the high level voltage through the switching transistor TS shown in FIG. 2.

Accordingly, a plurality of pixels PX_R connected to the data line D1 emit light with very low luminance. That is, a dark line appears according to the data line Dl. As described above, the line electrically connected to the data line D1 connected to the pixel column may be detected as a shorted line.

In the exemplary embodiment of FIG. 3, the line L1 is shorted with the first voltage source ELVDD, in one or more embodiments, one or of the lines may be shorted with other components, e.g., the lines L1-Lk may be shorted to the second voltage source ELVSS.

Figure 4:
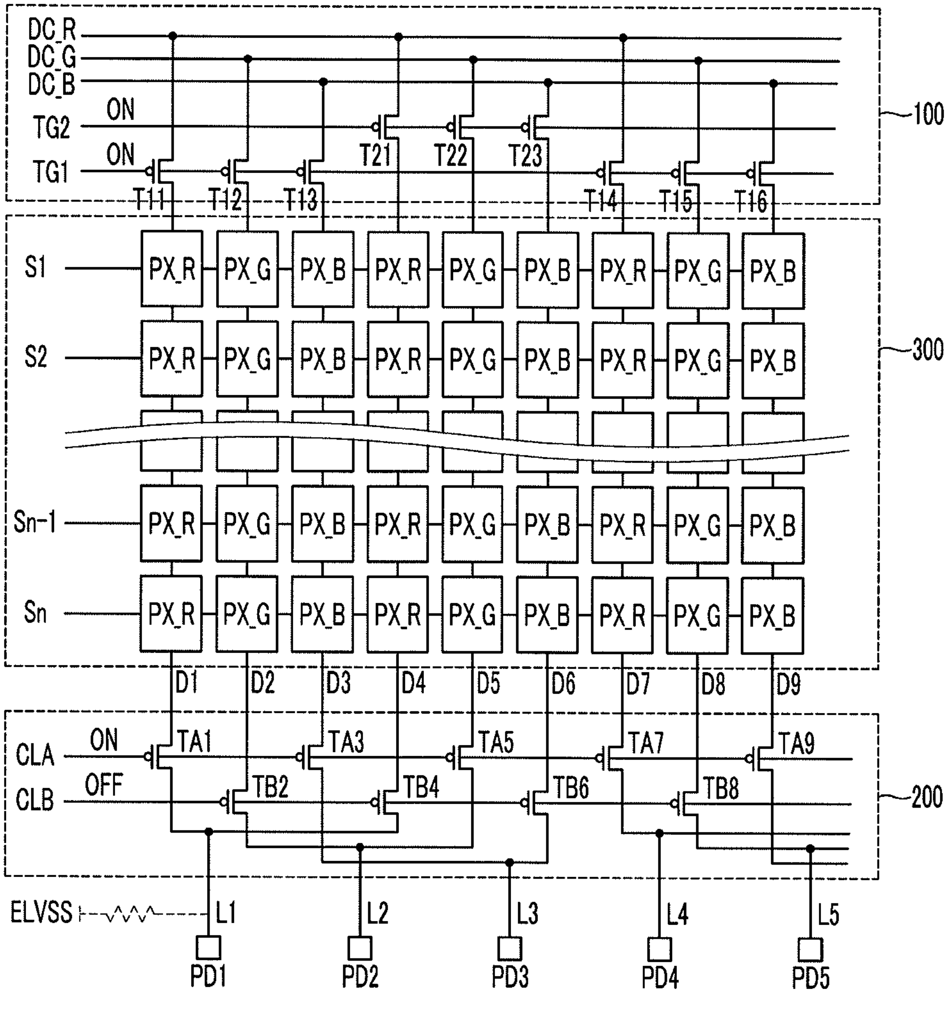
FIG. 4 illustrates schematic view of the defect detecting device and the demultiplexer of FIG. 1 in another defective state.

FIG. 4 illustrates a schematic view of the defect detecting device 100 and the demultiplexer 200 of FIG. 1 in another defective state (e.g., L1 shorted with the second power source voltage ELVSS). More particularly, FIG. 4 shows a state that the line L1 is shorted to the voltage ELVSS. Thus, the data line D1 is supplied with a low level voltage similar to a voltage of the second voltage source ELVSS. Accordingly, the gate electrode of the driving transistor TD is supplied with the low level voltage through the respective switching transistor TS.

Accordingly, the plurality of pixels PX_R connected to the data line D1 emit light with very high luminance. That is, a bright line appears according to the data line D1. As described above, as a result of the luminance level, e.g., the line electrically connected to the corresponding data line connected to the pixel column may be detected as shorted.

As described above, in one or more embodiments, a line corresponding to a pixel column displayed as relatively darker line or a relatively brighter line among a plurality of pixel columns may be determined to be shorted. Further, in the exemplary embodiment and conditions of FIG. 4, when the line L2 is shorted, the pixel column connected to the data lines D5 would be displayed as the dark line or the bright line, when the line L3 is shorted, the pixel column connected to the data lines D3 would be displayed as the dark line or the bright line, and when the line L4 is shorted, the pixel column connected to the data lines D7 would be displayed as the dark line or the bright line.

In the exemplary embodiments of FIGS. 3 and 4, a condition that a plurality of the first TFTs TA1, TA3, . . . , TAm are in the turned-on state is described, however, in one or more embodiments, a plurality of the second TFTs TB2, TB4, . . . , TBm-1 instead of a plurality of the first TFTs TA1, TA3, . . . , TAm may be in the turned-on state.

Figure 5:
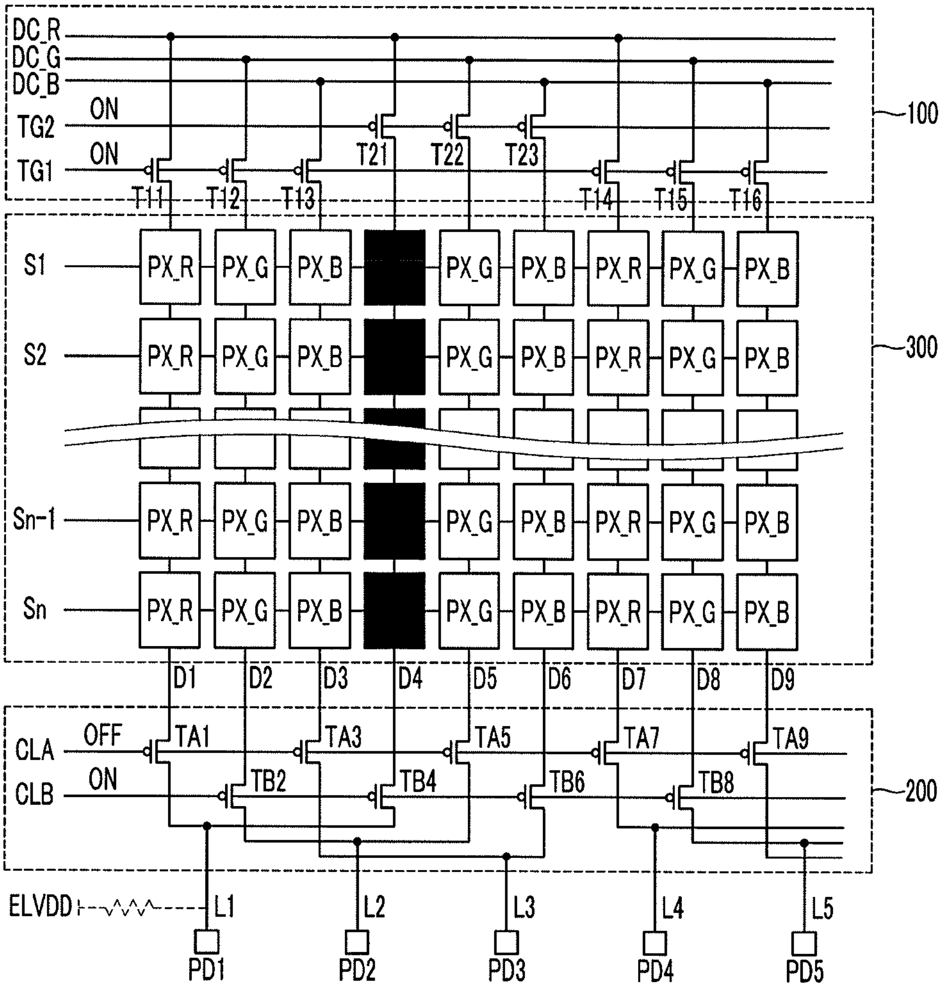
FIG. 5 illustrates schematic view of the defect detecting device and the demultiplexer of FIG. 1 in another defective state.

FIG. 5 illustrates schematic view of the defect detecting device 100 and the demultiplexer 200 of FIG. 1 in another defective state. In general, only differences between the different exemplary defective states are described below. As shown in FIG. 5, when a plurality of the second TFTs TB2, TB4, . . . , TBm-1 are in the turn-on state, only operations of the pixel array corresponding to the shorted line (e.g., line L1 shorted with the first voltage source ELVDD) are different form the above description of the pixels in a normal state (e.g., not shorted state). In FIG. 5, it is assumed that the line L1 is shorted to the voltage ELVDD. A resistor component may exist between the line L1 and the voltage ELVDD.

The line L1 is connected to the data line D4 through the turned-on second TFT TB4. Accordingly, the data line D4 is supplied with a high level voltage similar to a voltage of the first voltage source ELVDD. Thus, the gate electrode of the respective driving transistor TD is supplied with the high level voltage through the respective switching transistor TS shown in FIG. 2.

Accordingly, a plurality of the pixels PX_R connected to the data line D4 emit light with very low luminance. That is, the dark line appears according to the data line D4. As described above, the line electrically connected to the data line connected to the pixel column that is displayed as a dark line may be detected to be shorted.

Figure 6:
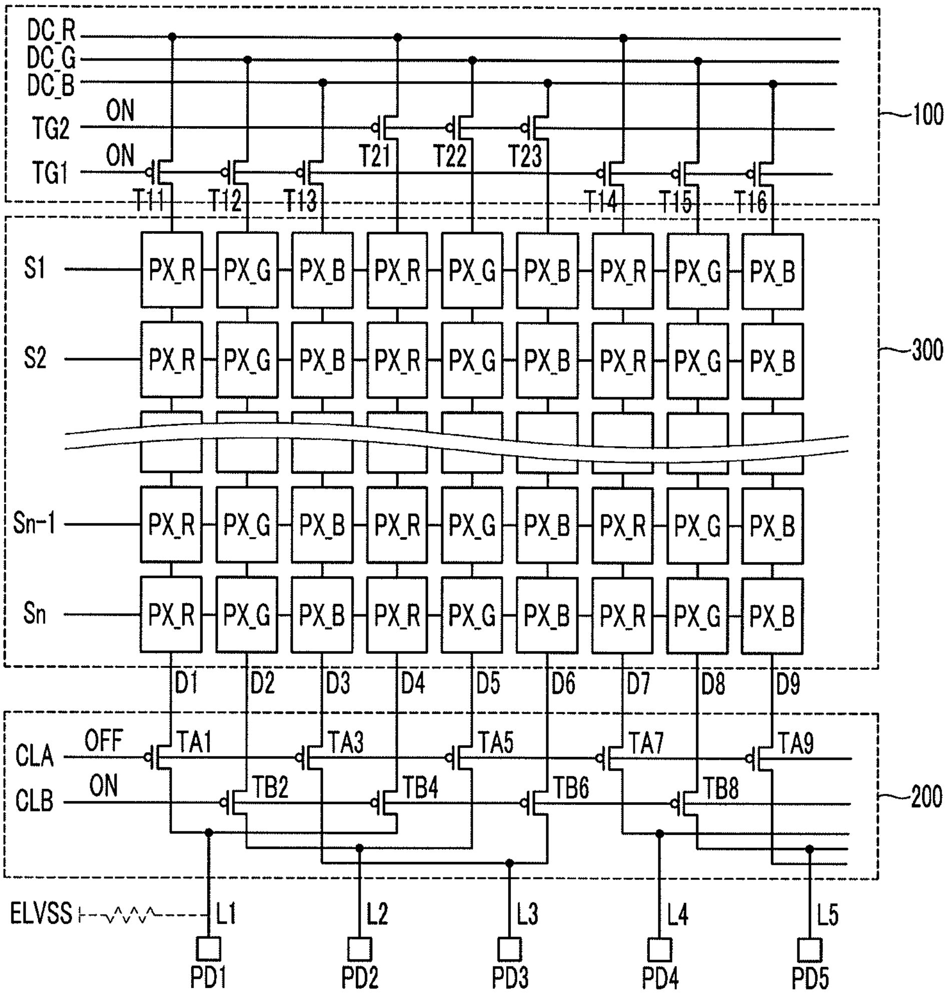
FIG. 6 illustrates schematic view of the defect detecting device and the demultiplexer of FIG. 1 in another defective state.

FIG. 6 illustrates schematic view of the defect detecting device 100 and the demultiplexer 200 of FIG. 1 in another defective state, e.g., a short line is generated. More particularly, FIG. 6 shows a state that the line L1 is shorted to the voltage ELVSS. As shown in FIG. 6, a plurality of the first switches T11-T1*a* and a plurality of the second switches T21-T2*b* are all in a turned-on state by the first gate signal TGS1 and the second gate signal TGS2, and a plurality of the second TFTs TB1, TB3, . . . , Tbm are in a turned-on state by the second control signal CON2.

Thus, the data lines D4 is supplied with the voltage of the low level similar to the voltage ELVSS. Therefore, the voltage of the low level is supplied to the gate electrode of the driving transistor TD through the switching transistor TS.

Accordingly, a plurality of pixels PX_R connected to the data line D4 emit light with very high luminance. That is, the bright line appears according to the data lines D4. As described above, the line electrically connected to the data line connected to the pixel column displayed as the bright line may be detected as shorted.

Through this method, the line corresponding to the pixel column that is displayed as the dark line or the bright line among a plurality of pixel columns may be determined as shorted. When the line L2 is shorted, the pixel column connected to the data line D5 is displayed as a bright line (i.e., relatively bright line) or a dark line (i.e., relatively dark line), when the line L3 is shorted, the pixel column connected to the data line D3 is displayed as a bright line or a dark line, and when the line L4 is shorted, the pixel column connected to the data line D7 is displayed as the bright line or the dark line.

Next, an exemplary embodiment of a defect detecting method of the demultiplexer 200 will be described with reference to FIGS. 7 to 10.

Like FIGS. 3-6, FIGS. 7-10 exemplarily show nine (9) pixel columns for understanding and ease of description.

Furthermore, to detect the defect of the demultiplexer, a plurality of scan lines S1-Sn are transmitted with a plurality of scan signals of the level for turning on the switching transistor TS. When detecting the defect of the demultiplexer, the level of the red, green, and blue DC voltages RDV, GDV, and BDV may be determined as the appropriate voltage capable of detecting the defective TFT generated in the demultiplexer.

Figure 7:
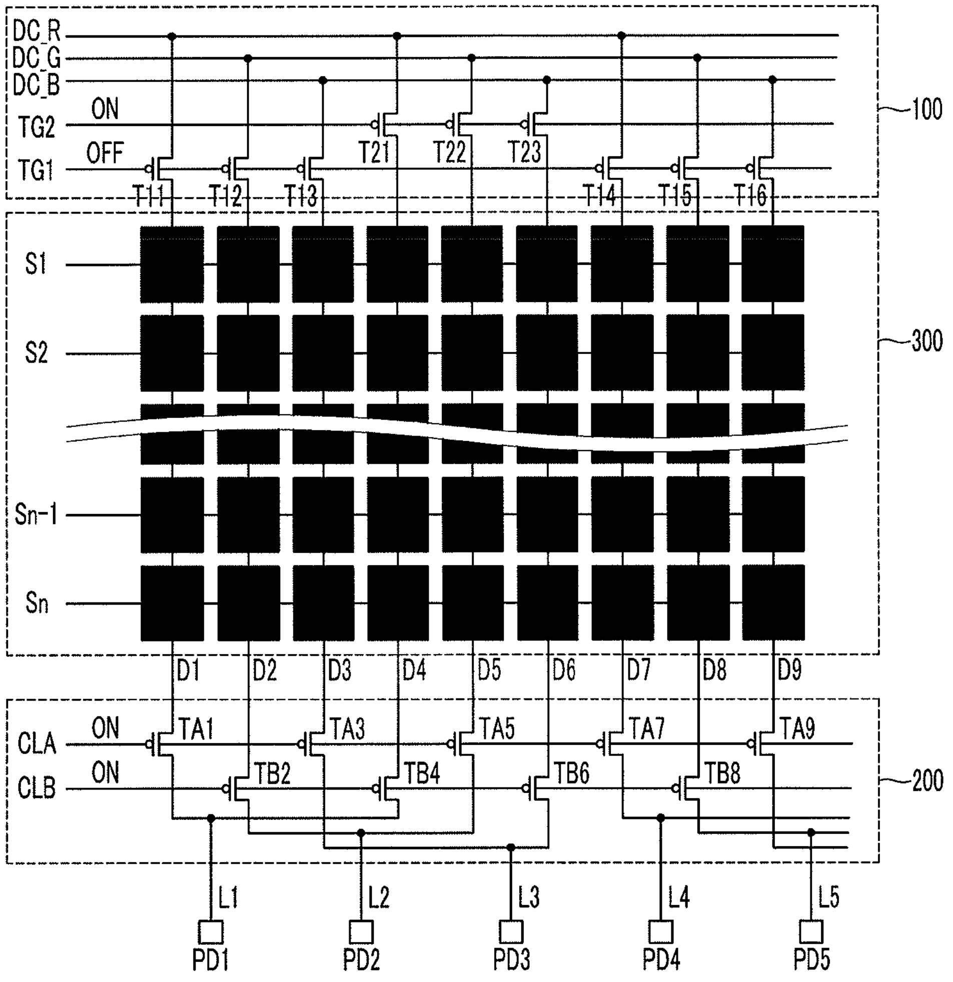
FIG. 7 illustrates schematic view of the defect detecting device and the demultiplexer of FIG. 1 in another defective state.

FIG. 7 illustrates schematic view of the defect detecting device 100 and the demultiplexer 200 of FIG. 1 in another defective state, e.g., a short line is generated.

As shown in FIG. 7, only the switch of one group is in the turn-on state among a plurality of the first switches T11-T1*a* and a plurality of the second switches T21-T2*b* by the first gate signal TGS1 and the second gate signal TGS2.

In an exemplary embodiment of FIG. 7, a plurality of the second switches T21-T2*b* are turned on by the second gate signal TG2 and a plurality of the first switches T11-T1*a* are turned off by the first gate signal TG 1.

Furthermore, a plurality of the first TFTs TA1, TA3, . . . , TAm are in the turn-on state by the first control signal CON1, and a plurality of the second TFT TB2, TB4, . . . , TBm-1 are in the turn-on state by the second control signal CON2.

Thus, the red, green, and blue DC voltages RDV, GDV, and BDV are connected to a plurality of data lines Dl-Dm through a plurality of the second switches T21-T2*b*, a plurality of the first TFTs TA1, TA3, . . . , TAm, and a plurality of the second TFTs TB2, TB4, . . . , TBm-1 that are turned on.

That is, all red, green, and blue pixels PX_R, PX_G, and PX_B of the display unit 300 are supplied with the corresponding red, green, and blue DC voltages RDV, GDV, and BDV.

In the exemplary embodiment, the red, green, and blue DC voltages RDV, GDV, and BDV for the detection of the defect of the demultiplexer 300 may be determined as a voltage corresponding to a voltage by which no light is emitted from the respective pixels.

In detail, a path including the second switch T21, the data line D4, the second TFT TB4, the first TFT TA1, and the data line D1 is formed, and the red DC voltage RDV is supplied to a plurality of red pixels PX_R connected to the data line D1 and the data line D4. A path including the second switch T22, the data line D5, the first TFT TA5, the second TFT TB2, and the data line D2 is formed, and the green DC voltage GDV is supplied to a plurality of green pixels PX_G connected to the data line D2 and the data line D5. A path including the second switch T23, the data line D6, the second TFT TB6, the first TFT TA3, and the data line D3 is formed, and the blue DC voltage BDV is supplied to a plurality of blue pixels PX_B connected to the data line D3 and the data line D6.

Through this method, if all pixels are supplied with the corresponding DC voltage, the entire display unit 300 displays the black. However, when the defective TFT is generated among a plurality of the first TFTs TA1, TA3, . . . , TAm and a plurality of the second TFTs TB2, TB4, . . . , TBm-1 forming the demultiplexer 200, the data line of the path including the defective TFT is not supplied with the corresponding DC voltage.

Figure 8:
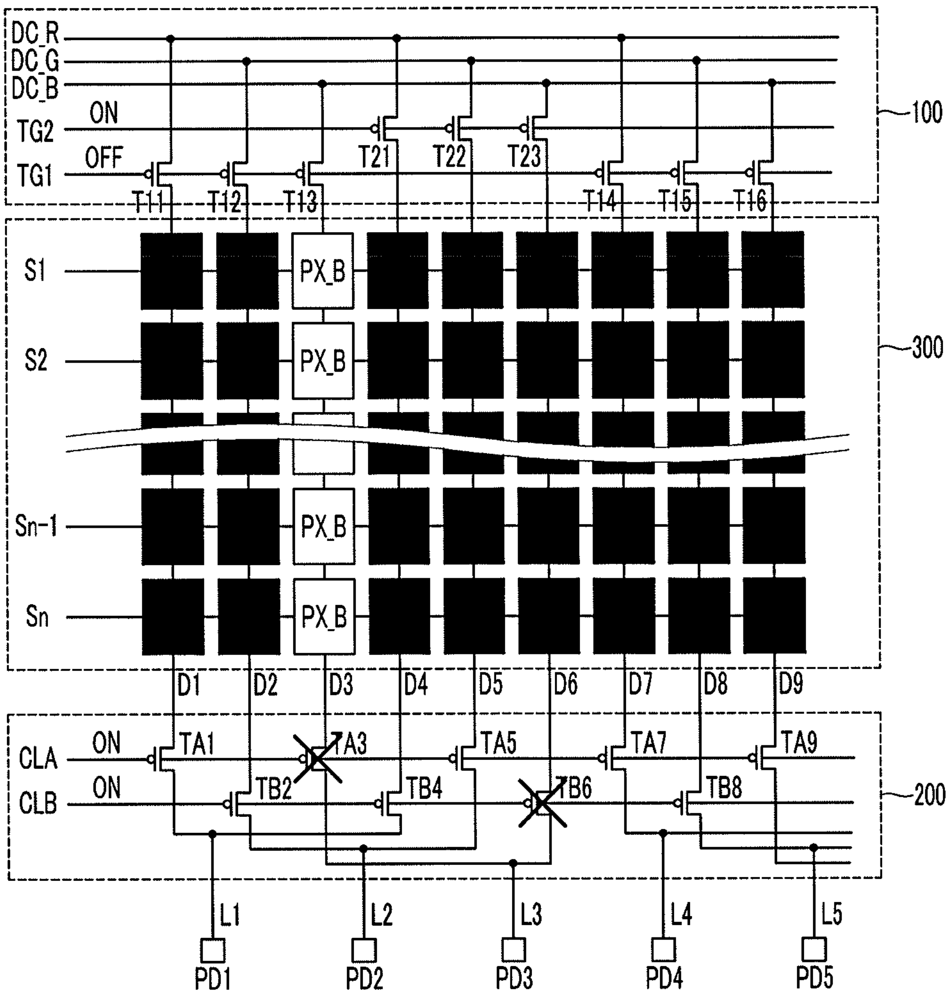
FIG. 8 illustrates schematic view of the defect detecting device and the demultiplexer of FIG. 1 in another defective state.

FIG. 8 illustrates schematic view of the defect detecting device 100 and the demultiplexer 200 of FIG. 1 in another defective state, e.g., a defective TFT is generated. For example, it is assumed that at least one among the second TFT TB6 and the first TFT TA3 is defective.

When the second TFT TB6 is defective, the data lines D3 are not supplied with the blue DC voltage BDV. Accordingly, a plurality of pixels PX_B connected to the data line D3 do not display the black and emit light with a predetermined luminance. That is, the bright line is generated. When the first TFT TA3 instead of the second TFT TB6 is defective, the pixel column connected to the data line D3 is displayed with the bright line. That is, at least one of the first TFT and the second TFT connected to the data line is defective.

Through this method, the first TFT or the second TFT that is defective by the data line such that the dark line is generated may be detected.

However, embodiments are not limited thereto, and a plurality of the first switches T11-T1*a* instead of a plurality of the second switches T21-T2*b* may be turned on.

Figure 9:
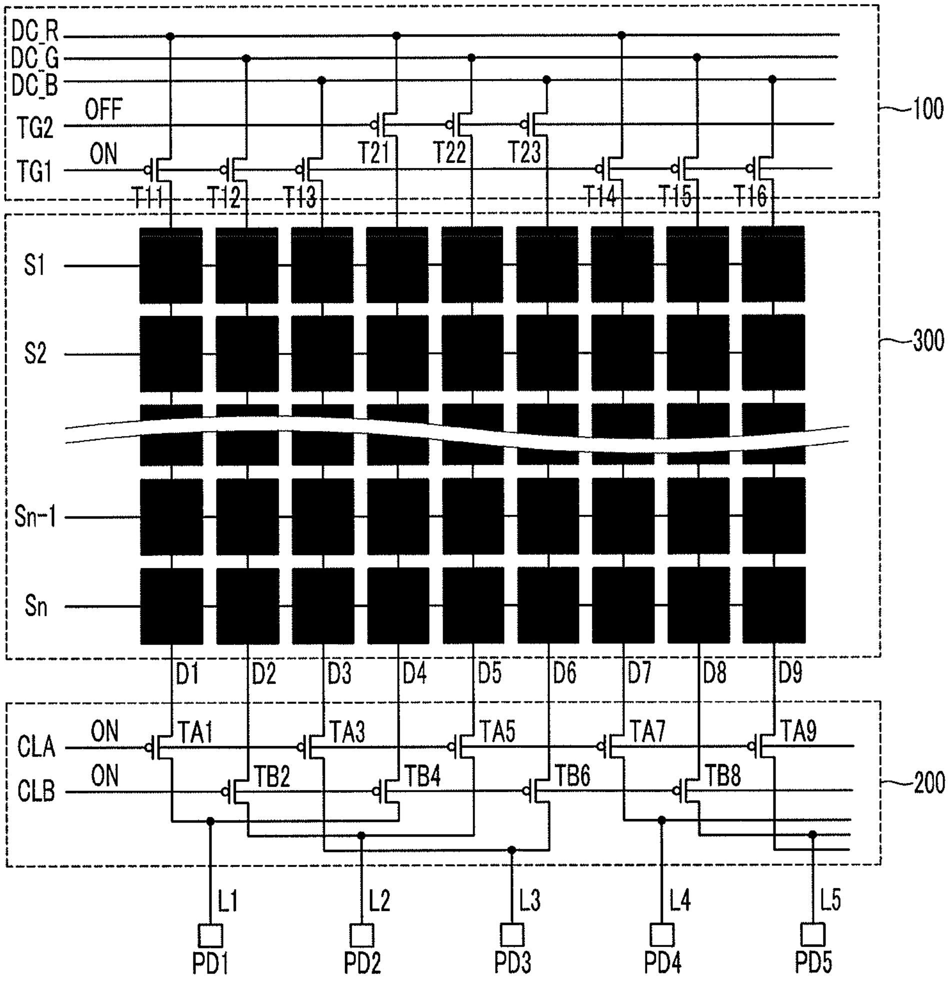
FIG. 9 illustrates schematic view of the defect detecting device and the demultiplexer of FIG. 1 in another defective state.

FIG. 9 illustrates schematic view of the defect detecting device 100 and the demultiplexer 200 of FIG. 1 in another defective state.

As shown in FIG. 9, it is assumed that a plurality of the second switches T21-T2*b* are turned off by the second gate signal TG2, and a plurality of the first switch T11-T1*a* are turned on by the first gate signal TG1.

Furthermore, a plurality of the first TFTs TA1, TA3, . . . , TAm are in the turned-on state by the first control signal CON1, and a plurality of the second TFT TB2, TB4, . . . , TBm-1 are in the turn-on state by the second control signal CON2.

Thus, the red, green, and blue DC voltages RDV, GDV, and BDV are connected to a plurality of data lines Dl-Dm through a plurality of the first switches T11-T1*a*, a plurality of the first TFTs TA1, TA3, . . . , TAm, and a plurality of the second TFTs TB2, TB4, . . . , TBm-1 that are turned on.

That is, all red, green, and blue pixels PX_R, PX_G, and PX_B of the display unit 300 may be supplied with the corresponding red, green, and blue DC voltages RDV, GDV, and BDV, and the red, green, and blue DC voltages RDV, GDV, and BDV to detect the defect of the demultiplexer 300 may be determined as the voltage capable of light-emitting the pixel.

In detail, the path including the first switch T21, the data line Dl, the first TFT TA1, the second TFT TB4, and the data line D4 is formed, and the red DC voltage RDV is supplied to a plurality of red pixels PX_R connected to the data line Dl and the data line D4. The path including the first switch T12, the data line D2, the second TFT TB2, the first TFT TAS, and the data line D5 is formed, and the green DC voltage GDV is supplied to a plurality of green pixels PX_G connected to the data line D2 and the data line D5. The path including the first switch T13, the data line D3, the first TFT TA3, the second TFT TB6, and the data line D6 is formed, and the blue DC voltage BDV is supplied to a plurality of blue pixels PX_B connected to the data line D3 and the data line D6.

If all pixels are supplied with the corresponding DC voltage, the entire display unit 300 is displayed as black. However, when the defective TFT is generated among a plurality of the first TFT TA1, TA3, . . . , TAm and a plurality of the second TFT TB2, TB4, . . . , TBm-1 forming the demultiplexer 300, the data line including the defective TFT is not supplied with the corresponding DC voltage.

Figure 10:
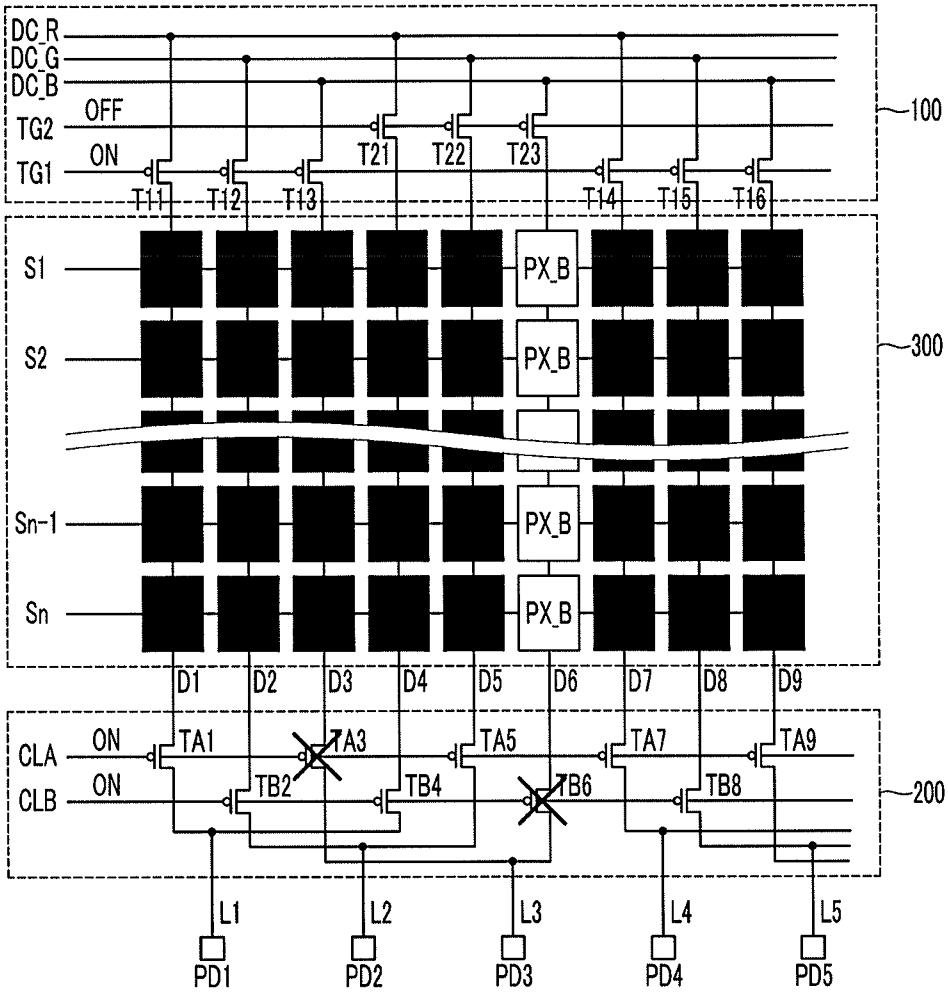
FIG. 10 illustrates schematic view of the defect detecting device and the demultiplexer of FIG. 1 in another defective state.

FIG. 10 illustrates schematic view of the defect detecting device 100 and the demultiplexer 200 of FIG. 1 in another defective state. For example, it is assumed that at least one of the second TFT TB6 and the first TFT TA3 is defective like FIG. 8.

When the second TFT TB6 is defective, the data line D6 is not supplied with the blue DC voltage BDV. Accordingly, a plurality of pixels PX_B connected to the data line D6 are not displayed with the black, but are light-emitted with the predetermined luminance. That is, the bright line is generated. When the first TFT TA3 is defective instead of the second TFT TB6, the pixel column connected to the data line D6 is also displayed with the bright line. That is, at least one of the first TFT and the second TFT connected to the data line is defective.

Through this method, the first TFT or the second TFT that is defective by the data such that the bright line is generated may be detected.

DESCRIPTION OF SYMBOLS defect detecting device 100
data lines Dl-Dm
test gate signals TGS1 and TGS2
red DC voltage RDV
green DC voltage GDV
blue DC voltage BDV
gate line TG1 and TG2
red DC line DC_R
green DC line DC_G
blue DC line DC_B
first control switch T11-T1*a*
display unit 300
second control switch T21-T2*b*
scan line S1-Sn
pixel PX_R, PX_G, PX_B
switching transistor TS
driving transistor TD
capacitor C
organic light emitting element OLED
first TFT TA1, TA3, . . . TAm
second TFT TB2, TB4, . . . TBm-1
first control line CLA
second control line CLB
line L1-Lk
pad PD1-PDk Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A defect detecting device using a demultiplexer connecting corresponding ones of a plurality of data lines to a plurality of lines, the defect detecting device comprising:

first to third DC lines supplied with first to third DC voltages;

a plurality of first switches connected to the first to third DC lines and configured to transmit one of the first to third DC voltages to a plurality of first data lines among the plurality of data lines according to a first gate signal; and a plurality of second switches connected to the first to third DC lines and configured to transmit one of the first to third DC voltages to a plurality of second data lines among the plurality of data lines according to a second gate signal, wherein the demultiplexer includes:

a plurality of first TFTs connecting first terminals of the plurality of lines and the plurality of first data lines, and a plurality of second TFTs connecting the first terminals of the plurality of lines and the plurality of second data lines, wherein second terminals of the plurality of lines are in floating state, wherein the defect detecting device is configured to detect a short defect in the plurality of lines in a state when the plurality of the first switches and the plurality of the second switches are in an on state, and only one of the plurality of first TFTs or the plurality of second TFTs are in an on state.

2. The defect detecting device as claimed in claim 1, wherein:

when the plurality of first TFTs are in the on state, corresponding ones of the plurality of lines and the plurality of first data lines are connected through the plurality of first TFTs, respectively, and when one of the plurality of lines is shorted, the plurality of pixels, which are connected to the shorted line via corresponding ones of the first data lines, emit light according to a short voltage resulting from the shorted line.

3. The defect detecting device as claimed in claim 1, wherein:

when the plurality of second TFTs are in the on state, corresponding ones of the plurality of lines and the plurality of second data lines are connected through the plurality of second TFTs, and when one of the plurality of lines is shorted, the plurality of pixels, which are connected to the shorted line via the corresponding ones of the second data lines, emit light according to a short voltage resulting from the shorted line.

4. A defect detecting device using a demultiplexer connecting corresponding ones of a plurality of data lines to a plurality of lines, the defect detecting device comprising:

first to third DC lines supplied with first to third DC voltages;

a plurality of first switches connected to the first to third DC lines and configured to transmit one of the first to third DC voltages to a plurality of first data lines among the plurality of data lines according to a first gate signal; and a plurality of second switches connected to the first to third DC lines and configured to transmit one of the first to third DC voltages to a plurality of second data lines among the plurality of data lines according to a second gate signal, wherein the demultiplexer includes:

a plurality of first TFTs connecting first terminals of the plurality of lines and the plurality of first data lines, and a plurality of second TFTs connecting the first terminals of the plurality of lines and the plurality of second data lines, wherein second terminals of the plurality of lines are in floating state, wherein the defect detecting device is configured to detect a defect in the plurality of the first TFTs and the plurality of the second TFTs in a state when the plurality of the first TFTs and the plurality of the second TFTs are in an on state, and only one of the plurality of the first switches or the plurality of second switches are in an on state.

5. The defect detecting device as claimed in claim 4, wherein when the plurality of the first switches are in the on state, the plurality of first data lines are connected to corresponding ones of the plurality of second data lines through respective ones of the first and the second TFTs.

6. The defect detecting device as claimed in claim 5, wherein when at least one of the first and the second TFTs is defective, corresponding ones of the plurality of second data lines do not receive the corresponding one of the DC voltages among the first to third DC voltages.

7. The defect detecting device as claimed in claim 4, wherein when a plurality of the second switches are in the on state, the plurality of second data lines are connected to corresponding ones of the plurality of first data lines through respective ones of the first and the second TFTs.

8. The defect detecting device as claimed in claim 7, wherein when at least one of the first and the second TFTs is defective, corresponding ones of the plurality of first data lines do not receive the corresponding one of the DC voltages among the first to third DC voltages.

9. The defect detecting device as claimed in claim 1, wherein each of the plurality of first switches include a gate electrode configured to receive the first gate signal, a first electrode connected to a corresponding one of the first to third DC lines, and a second electrode connected to a corresponding one of the first data lines.

10. The defect detecting device as claimed in claim 1, wherein each of the plurality of second switches include a gate electrode configured to receive the second gate signal, a first electrode connected to a corresponding one of the first to third DC lines, and a second electrode connected to a corresponding one of the second data lines.

11. A defect detecting method for a first terminal of a line connected to a first data line corresponding to a first pixel array and a second data line corresponding to a second pixel array, the line connected to the first data line through a first TFT and the line connected to the second data line through a second TFT, the defect detecting method comprising:

supplying a first DC voltage to the first data line and the second data line at a same time, the first DC voltage supplied to the first data line through a first switch and supplied to the second data line through a second switch;

turning on only one of the first TFT or the second TFT, the first TFT corresponding to the first data line and the second TFT corresponding to the second data line; and detecting a defect according to a light emitting state of the first or the second pixel array connected to the turned-on one of the first or the second TFTs, wherein a second terminal of the line is in a floating state.

12. The defect detecting method as claimed in claim 11, wherein when the first TFT is turned on, detecting a defect includes detecting the line as defective when the first pixel array is in a light emitting state that produces a dark line or a bright line relative to a predetermined luminance.

13. The defect detecting method as claimed in claim 12, wherein detecting a defect includes detecting the line as defective when the first pixel array is in a light emitting state that produces a line that is dark or bright relative to an intermediate grayscale among a grayscale range.

14. The defect detecting method as claimed in claim 11, wherein when the second TFT is turned on, detecting a defect includes detecting the line as defective when the second pixel array is in a light emitting state that produces a dark line or a bright line relative to a predetermined luminance.

15. A defect detecting method for a demultiplexer including a first TFT and a second TFT respectively connected to a first data line connected to a first terminal of a first switch and a first pixel array and a second data line connected to a first terminal of a second switch and a second pixel array, the defect detecting method comprising:

applying a first DC voltage to a second terminal of the first switch and a second terminal of the second switch;

turning on only one of the first switch or the second switch;

turning on the first TFT and the second TFT, the first TFT connecting a line to the first data line and the second TFT connecting the line to the second data line; and detecting a defect in the first TFT and/or the second TFT according to a light emitting state of the first pixel array and the second pixel array, wherein the first data line is connected to the line through a node and wherein the second data line is connected to the line through the node.

16. The defect detecting method as claimed in claim 15, wherein detecting a defect includes detecting a defect in the first TFT and/or the second TFT when the light emitting state of the first pixel array and the second pixel array are different.

17. The defect detecting method as claimed in claim 16, wherein when the first switch is turned on, detecting a defect includes detecting at least one of the first TFT and the second TFT as defective when the first pixel array is displayed with black and the second pixel array is displayed with a predetermined luminance.

18. The defect detecting method as claimed in claim 16, wherein when the second switch is turned on, detecting a defect includes detecting at least one of the first TFT and the second TFT as defective when the second pixel array is displayed with black, and the first pixel array is displayed with a predetermined luminance.

* * * * *